United States Patent
Horibe et al.

(10) Patent No.: US 10,930,665 B2
(45) Date of Patent: Feb. 23, 2021

(54) SEMICONDUCTOR DEVICE

(71) Applicant: Toshiba Memory Corporation, Minato-ku (JP)

(72) Inventors: Kosuke Horibe, Yokkaichi (JP); Kei Watanabe, Yokkaichi (JP); Toshiyuki Sasaki, Yokkaichi (JP); Tomo Hasegawa, Yokkaichi (JP); Soichi Yamazaki, Yokkaichi (JP); Keisuke Kikutani, Yokkaichi (JP); Jun Nishimura, Kuwana (JP); Hisashi Harada, Yokkaichi (JP); Hideyuki Kinoshita, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/536,552

(22) Filed: Aug. 9, 2019

(65) Prior Publication Data

US 2020/0235117 A1  Jul. 23, 2020

(30) Foreign Application Priority Data

Jan. 17, 2019  (JP) ............................. JP2019-005636

(51) Int. Cl.

| | | |
|---|---|---|
| *H01L 27/11578* | (2017.01) | |
| *G11C 16/04* | (2006.01) | |
| *H01L 27/11565* | (2017.01) | |
| *H01L 27/11573* | (2017.01) | |

(52) U.S. Cl.
CPC .... *H01L 27/11578* (2013.01); *G11C 16/0466* (2013.01); *H01L 27/11565* (2013.01); *H01L 27/11573* (2013.01)

(58) Field of Classification Search
CPC ......... H01L 27/11578; H01L 27/11573; H01L 27/11565; G11C 16/0466
See application file for complete search history.

(56) References Cited

U.S. PATENT DOCUMENTS

| | | | |
|---|---|---|---|
| 8,614,126 | B1 | 12/2013 | Lee et al. |
| 9,064,970 | B2 | 6/2015 | Simsek-Ege et al. |
| 9,130,052 | B2 | 9/2015 | Kim et al. |

(Continued)

FOREIGN PATENT DOCUMENTS

| | | |
|---|---|---|
| JP | 2018-005961 A | 1/2018 |
| JP | 2018-152412 A | 9/2018 |
| JP | 20018-157103 A | 10/2018 |

*Primary Examiner* — Victor A Mandala
(74) *Attorney, Agent, or Firm* — Oblon, McClelland, Maier & Neustadt, L.L.P.

(57) ABSTRACT

A semiconductor device of an embodiment includes a control circuit arranged on a substrate, a first conductive layer arranged on the control circuit and containing a first element as a main component, a multilayer structure arranged on the first conductive layer and configured such that multiple second conductive layers and multiple insulating layers are alternately stacked on each other, a memory layer penetrating the multilayer structure and reaching the first conductive layer at a bottom portion, a first layer arranged between the control circuit and the first conductive layer and containing the first element as a main component, and a second layer arranged between the control circuit and the first layer and containing, as a main component, a second element different from the first element.

20 Claims, 6 Drawing Sheets

(56) References Cited

U.S. PATENT DOCUMENTS

| | | | |
|---|---|---|---|
| 9,431,409 B2 | 8/2016 | Lee et al. | |
| 9,460,931 B2 | 10/2016 | Pachamuthu et al. | |
| 9,559,109 B2 | 1/2017 | Simsek-Ege et al. | |
| 9,595,531 B2 | 3/2017 | Zhu et al. | |
| 9,754,820 B2 | 9/2017 | Tsutsumi et al. | |
| 9,842,855 B2 | 12/2017 | Lee | |
| 9,985,048 B2 | 5/2018 | Lee | |
| 10,002,767 B2 | 6/2018 | Zhu et al. | |
| 10,109,353 B2 | 10/2018 | Ueno et al. | |
| 2012/0256253 A1 | 10/2012 | Hwang et al. | |
| 2013/0228739 A1* | 9/2013 | Sasago | H01L 45/04 257/4 |
| 2017/0133392 A1 | 5/2017 | Simsek-Ege et al. | |
| 2017/0200801 A1 | 7/2017 | Hopkins et al. | |
| 2017/0207226 A1* | 7/2017 | Lee | H01L 27/11582 |
| 2017/0373084 A1* | 12/2017 | Shim | H01L 23/528 |
| 2018/0261529 A1 | 9/2018 | Yoshimizu et al. | |
| 2018/0268902 A1 | 9/2018 | Tanaka | |
| 2018/0269210 A1* | 9/2018 | Tezuka | H01L 27/1225 |
| 2019/0019559 A1 | 1/2019 | Ueno et al. | |
| 2019/0081065 A1* | 3/2019 | Lee | H01L 21/768 |
| 2020/0168619 A1* | 5/2020 | Zhou | H01L 27/11582 |

* cited by examiner

SEMICONDUCTOR DEVICE

CROSS-REFERENCE TO RELATED APPLICATIONS

This application is based upon and claims the benefit of priority from Japanese Patent Application No. 2019-005636, filed on Jan. 17, 2019; the entire content of which are incorporated herein by reference.

FIELD

Embodiments described herein relate generally to a semiconductor device.

BACKGROUND

A three-dimensional non-volatile memory includes a memory layer having a channel layer charged in a memory hole extending to penetrate a multilayer structure of a conductive layer and an insulating layer. For example, a wiring layer of a control circuit configured to control a memory cell through a source wiring layer connected to the channel layer is arranged below the multilayer structure.

BRIEF DESCRIPTION OF THE DRAWINGS

FIGS. 5Ab and 5Eb are flow diagrams illustrating one example of the steps of the processing of manufacturing the semiconductor devices according to the embodiment and the comparative example;

FIGS. 6Ab and 6Db are flow diagrams illustrating one example of the steps of the processing of manufacturing the semiconductor devices according to the embodiment and the comparative example.

DETAILED DESCRIPTION

A semiconductor device of an embodiment includes a control circuit arranged on a substrate, a first conductive layer arranged on the control circuit and containing a first element as a main component, a multilayer structure arranged on the first conductive layer and configured such that multiple second conductive layers and multiple insulating layers are alternately stacked on each other, a memory layer penetrating the multilayer structure and reaching the first conductive layer at a bottom portion, a first layer arranged between the control circuit and the first conductive layer and containing the first element as a main component, and a second layer arranged between the control circuit and the first layer and containing, as a main component, a second element different from the first element.

Hereinafter, the present invention will be described in detail with reference to the drawings. Note that the present invention is not limited to the following embodiment. Moreover, components in the following embodiment include components easily arrived by those skilled in the art and substantially identical components.

Configuration Example of Semiconductor Device

Figure 1:
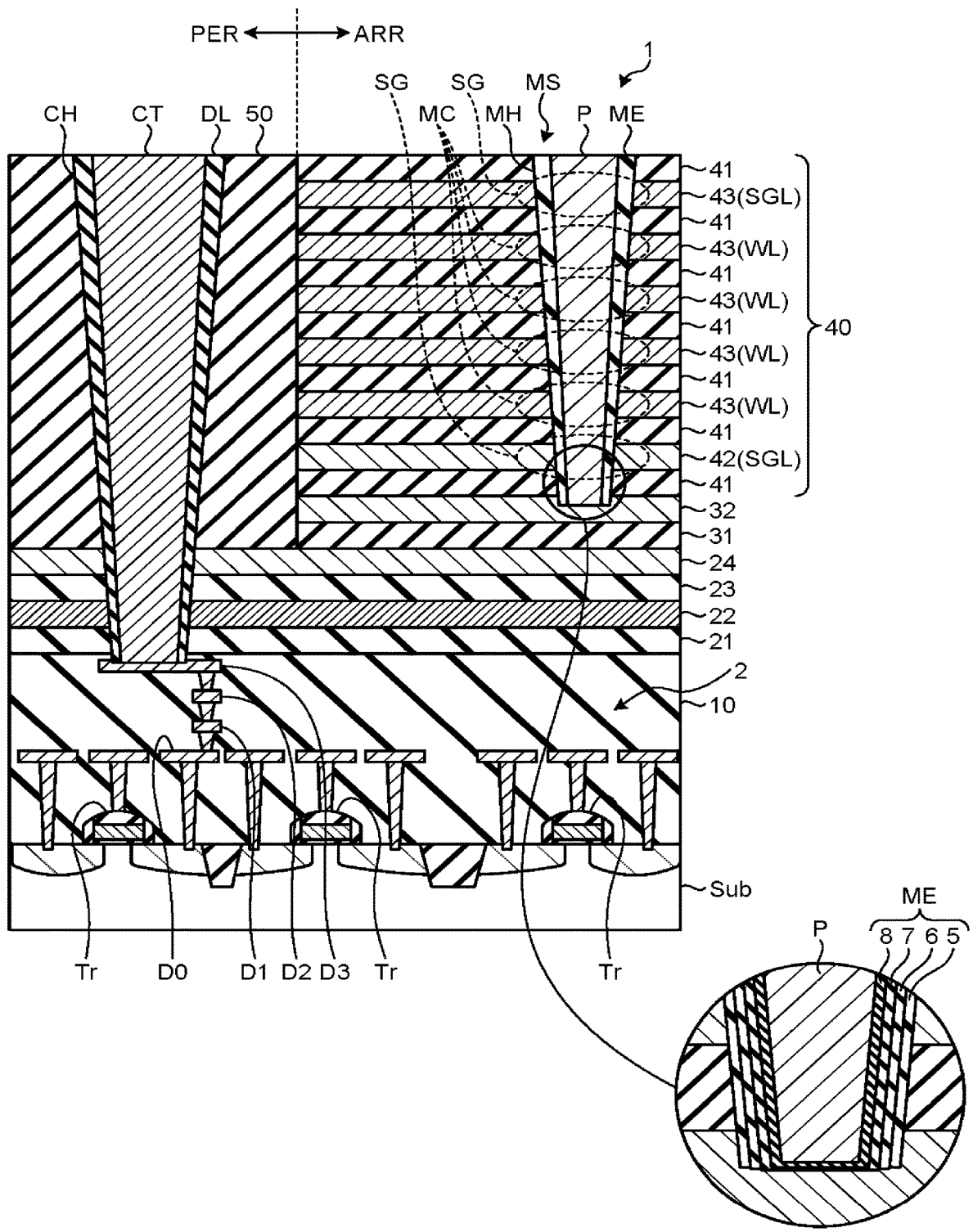
FIG. 1 is a sectional view illustrating a configuration example of a semiconductor device according to an embodiment.

FIG. 1 is a sectional view illustrating a configuration example of a semiconductor device 1 according to an embodiment. FIG. 1 illustrates a cell array region ARR as a memory region where later-described memory cells MC are arranged and a peripheral region PER arranged at the periphery of the cell array region ARR.

As illustrated in FIG. 1, the semiconductor device 1 includes, on a substrate Sub such as a silicon substrate, a control circuit 2 configured to control operation of the memory cells MC. The control circuit 2 has, for example, transistors Tr such as complementary metal oxide semiconductor (CMOS) transistors and wiring layers D0 to D3 connecting the transistors Tr to, for example, wiring of an upper layer. The control circuit 2 is covered with an interlayer insulating layer 10.

On the interlayer insulating layer 10, the semiconductor device 1 includes an adhesion layer 1, an etching stopper layer 22 as a second layer, an adhesion layer 23, and an etching stopper layer 24 as a first layer, in this order from the interlayer insulating layer 10 side.

The adhesion layers 21 and 23 are silicon nitride SiN) layers, for example. The adhesion layers 21 and 23 are layers for improving adhesion of layers arranged above and below the adhesion layer itself. The adhesion layers 21 and 23 are not necessarily provided.

The etching stopper layer 22 contains metal oxide containing, as a main component, at least one or more types of elements including Al, Zr, Ti, Hf, and Ta as a second element, for example. The etching stopper layer 22 is, as one specific example, an aluminum oxide ($Al_xO_y$) layer, for example.

As in, for example, a later-described source wiring layer 32, the etching stopper layer 24 contains, as a main component, silicon as a first element. The etching stopper layer 24 is, as some specific examples, at least any of a polysilicon (Poly-Si) layer, an amorphous silicon (α-si) layer, a silicon carbide (SiC) layer, and an oxygen-containing silicon carbide (SiOC) layer, for example.

In the cell array region ARR, the semiconductor device 1 includes, on the etching stopper layer 24, the source wiring layer 32 as a first conductive layer through an interlayer insulating layer 31. For example, the source wiring layer 32 contains, as a main component, silicon as the first element, and a polysilicon layer is one specific example.

The semiconductor device 1 includes a multilayer structure 40 on the source wiring layer 32. The multilayer structure 40 has such a structure that multiple insulating layers 41 and multiple conductive layers 43 as second conductive layers are alternately stacked on each other. The insulating layer 41 is a silicon oxide ($SiO_2$) layer, and the conductive layer 43 is a tungsten (W) layer, for example. Note that the lowermost conductive layer of the multilayer structure 40 is, for example, a conductive layer 42 as a third conductive layer such as a polysilicon layer.

The semiconductor device 1 includes multiple memory holes MH penetrating the multilayer structure 40 and reaching the source wiring layer 32 at bottom portions. An inner wall of the memory hole MH is covered with a memory layer ME. The memory layer ME has a multilayer structure of a block insulating layer 5, a charge storage layer 6, a tunnel insulating layer 7, and a channel layer 8 in this order from an inner wall side of the memory hole MH. The channel layer 8 also covers the bottom portion of the memory hole MH. The block insulating layer 5 and the tunnel insulating layer 7 are, for example, silicon oxide layers. The charge storage layer 6 is, for example, a silicon nitride layer. The channel layer 8 is, for example, a polysilicon layer or an amorphous silicon layer. The channel layer 8 is connected to the source wiring layer 32 at the bottom portion of the memory hole MH. The further inside of the memory layer ME in the memory hole MH is filled with a core layer P as a pillar containing, for example, silicon oxide as a main component.

With the above-described configuration, the memory cell MC including the memory layer ME is arrayed along a height direction of the core layer P at a height position of each conductive layer 43. The memory cell MC nonvolatilely stores data according to the presence or absence of charge held by the charge storage layer 6. The multiple memory cells MC are each arranged at such multiple positions that the core layer P crosses the conductive layers 43, and therefore, the cell array region ARR where these memory cells MC are arranged in matrix is formed.

Moreover, as described above, the multiple memory cells MC continuously provided in the height direction along the single core layer P form a memory string MS. The lowermost conductive layer 42 and the uppermost conductive layer 43 function as selection gate lines SGL connected to selection gates SG including the memory layer ME. The selection gate SG brings the memory string MS to which the selection gate SG itself belongs into a selection state or a non-selection state. Other conductive layers 43 function as word lines WL connected to the memory cells MC at the same heights as the conductive layers 43.

Note that the number of word lines WL to be stacked and the number of memory cells MC included in the single memory string MS are optional.

In the peripheral region PER, the semiconductor device 1 includes an interlayer insulating layer 50 on the etching stopper layer 24. The interlayer insulating layer 50 is, for example, a silicon oxide layer such as a TEOS layer. The interlayer insulating layer 50 has the substantially same height as that of the multilayer structure 40 in the cell array region ARR.

The semiconductor device 1 includes multiple contact holes CH penetrating the interlayer insulating layer 50, the etching stopper layer 24, the adhesion layer 23, the etching stopper layer 22, and the adhesion layer 21 and reaching, at bottom portions, the interlayer insulating layer 10 covering the control circuit 2. An inner wall of the contact hole CH is covered with an insulating layer DL. The further inside of the insulating layer DL in the contact hole CH is filled with a contact CT containing a conductive material such as tungsten as a main component.

A bottom portion of the contact CT is connected to, for example, the wiring layer D3 of the control circuit 2. An upper end portion of the contact CT is connected to, for example, upper layer wiring (not illustrated). The upper layer wiring is, for example, connected to the channel layer 8 of the memory cells MC, the word lines WL, and the selection gate lines SGL. As described above, the control circuit 2 is, through the contact CT, electrically connected to the channel layer 8, the word lines WL, the selection gate lines SGL, etc. Thus, the control circuit 2 controls operations of the memory cells MC, the word lines WL, and the selection gate lines SGL.

Example of Processing of Manufacturing Semiconductor Device

Next, an example of the processing of manufacturing the semiconductor device 1 of the embodiment will be described with reference to FIGS. 2A to 4C. FIGS. 2A to 4C are flow diagrams illustrating one example of the steps of the processing of manufacturing the semiconductor device 1 according to the embodiment.

Figure 2A:
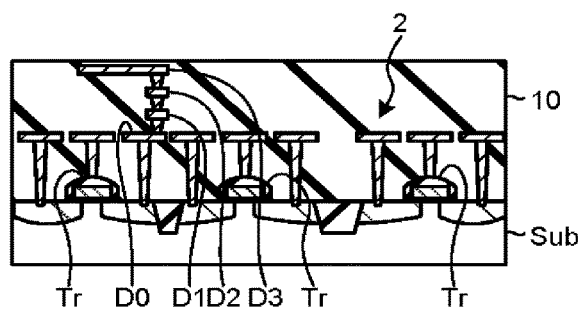
FIGS. 2A to 2D are flow diagrams illustrating one example of the steps of the processing of manufacturing the semiconductor device according to the embodiment.

As illustrated in FIG. 2A, the multiple transistors Tr and the wiring layers D0 to D3 connecting the transistors Tr to the contact CT etc. are formed on the substrate Sub such as a silicon substrate. In this manner, the control circuit 2 is formed. The formed control circuit 2 is covered with the interlayer insulating layer 10.

Figure 2B:
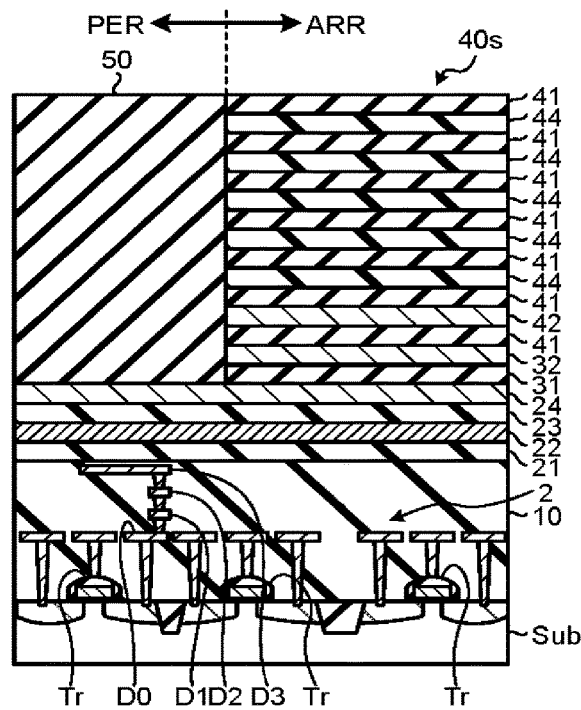

As illustrated in FIG. 2B, the adhesion layer 21, the etching stopper layer 22, the adhesion layer 23, and the etching stopper layer 24 are stacked in this order on the interlayer insulating layer 10.

The interlayer insulating layer 31, the source wiring layer 32, the insulating layers 41, and the conductive layer 42 are formed on the etching stopper layer 24 in a region corresponding to the cell array region ARR. Subsequently, the multiple insulating layers 41 and multiple sacrifice layers 44 are stacked in this order, and in this manner, a multilayer structure 40s including the insulating layers 41, the conductive layer 42, and the sacrifice layers 44 is formed. The sacrifice layers 44 are layers to be the conductive layers 43 later by replacement with a conductive material, and are silicon nitride layers, for example.

The interlayer insulating layer 50 is formed on the etching stopper layer 24 in a region corresponding to the peripheral region PER. The interlayer insulating layer 50 is formed at the substantially same height as that of an upper end portion of the multilayer structure 40s.

As illustrated in FIG. 2S, the multiple insulating layers 41 and the multiple sacrifice layers 44 are, using the conductive layer 42 as an etching stopper, dry-etched in the cell array region ARR. For using the conductive layer 42 as the etching stopper, etching conditions where the etching rate of the conductive layer 42 is lower than those of the insulating layer 41 and the sacrifice layer 44 and the insulating layer 41 and the sacrifice layer 44 have etching selectivity for the conductive layer 42 may be used. That is, the conductive layer 42 has etching resistance against these etching conditions.

Thus, the memory holes MH penetrating the multiple insulating layers 41 and the multiple sacrifice layers 44 and reaching the conductive layer 42 at the bottom portions are formed. A state in which the bottom portions reach the conductive layer 42 indicates a state in which the bottom portion of the memory hole MH at least contacts the conductive layer 42 without penetrating the conductive layer 42 or a state in which the bottom portion of the memory hole MH is in the conductive layer 42 without penetrating the conductive layer 42.

As illustrated in FIG. 2S, the bottom portion of each memory hole MH is further additionally dry-etched, and in this manner, the memory hole MH reaching the source wiring layer 32 at the bottom portion is formed. A state in which the bottom portion reaches the source wiring layer 32 indicates a state in which the bottom portion of the memory hole MH at least contacts the source wiring layer 32 without penetrating the source wiring layer 32 or a state in which the bottom portion of the memory hole MH is in the source wiring layer 32 without penetrating the source wiring layer 32. Moreover, the etching conditions at this point are conditions for actively etching the conductive layer 42 and the insulating layers 41.

Figure 2C:
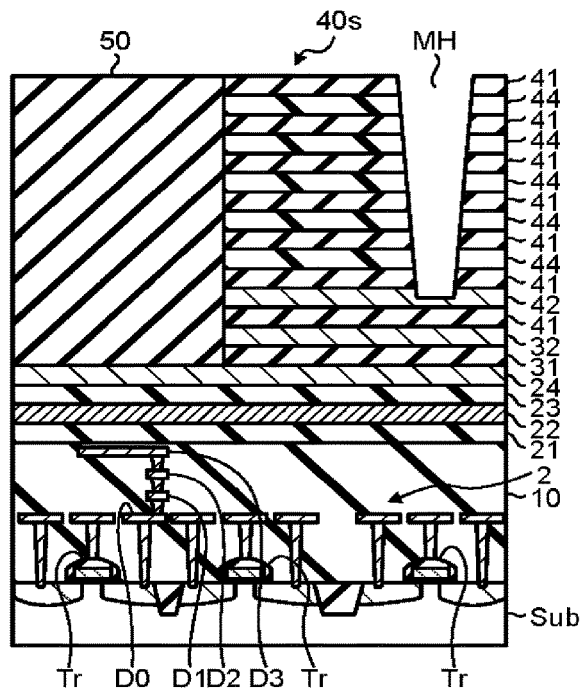
Figure 2D:
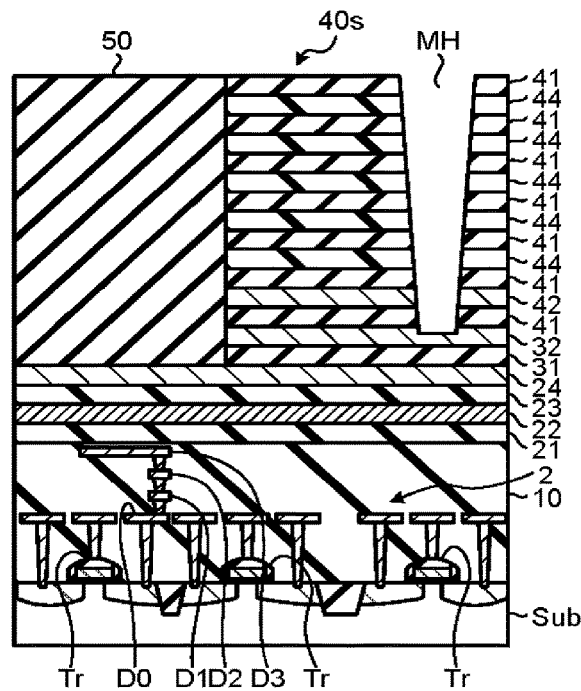

As illustrated in FIGS. 2C and 2D, each memory hole MH is formed in two stages so that the etching depths of the multiple memory holes MH can be uniformized. Thus, the memory holes MH more reliably reaching the source wiring layer 32 without penetrating the source wiring layer 32 can be formed.

Figure 3A:
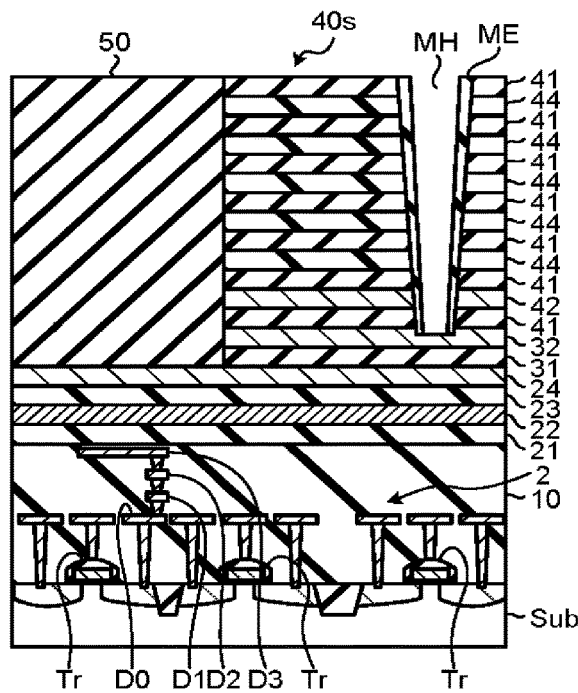
FIGS. 3A to 3D are flow diagrams illustrating one example of the steps of the processing of manufacturing the semiconductor device according to the embodiment.

As illustrated in FIG. 3A, the memory layer ME is formed so as to cover the inner wall of each memory hole MH. Specifically, the block insulating layer 5, the charge storage layer 6, the tunnel insulating layer 7, and the channel layer 8 are formed in this order from the inner wall side of the memory hole MH.

Figure 3B:
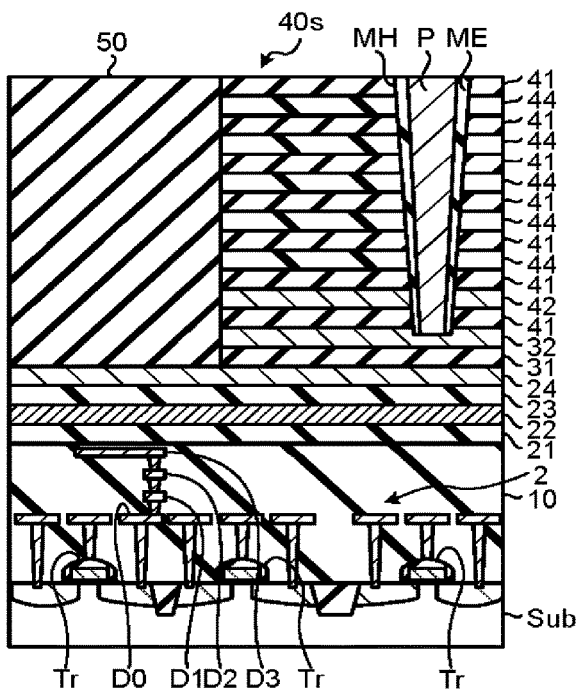

As illustrated in FIG. 3B, the further inside of the memory layer ME is filled with, for example, silicon oxide, and in this manner, the core layer P is formed. Thereafter, a slit (not illustrated) penetrating the multilayer structure 40s is formed.

Figure 3C:
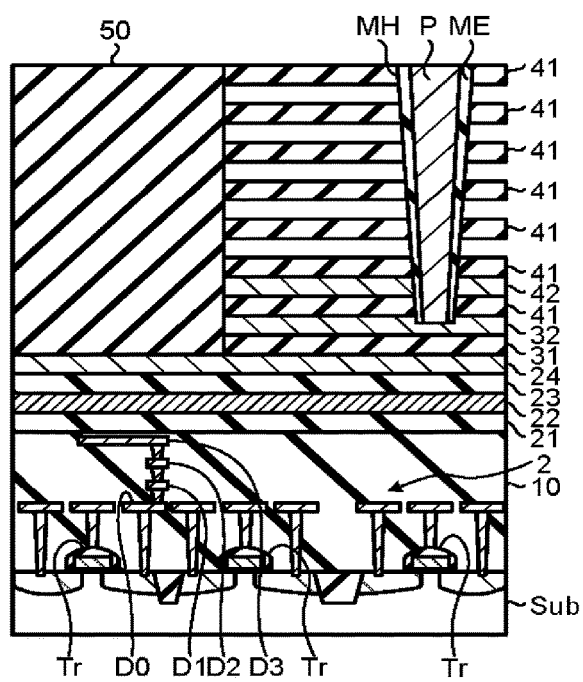

As illustrated in FIG. 3C, the sacrifice layers 44 of the multilayer structure 40s are removed through the slit.

Figure 3D:
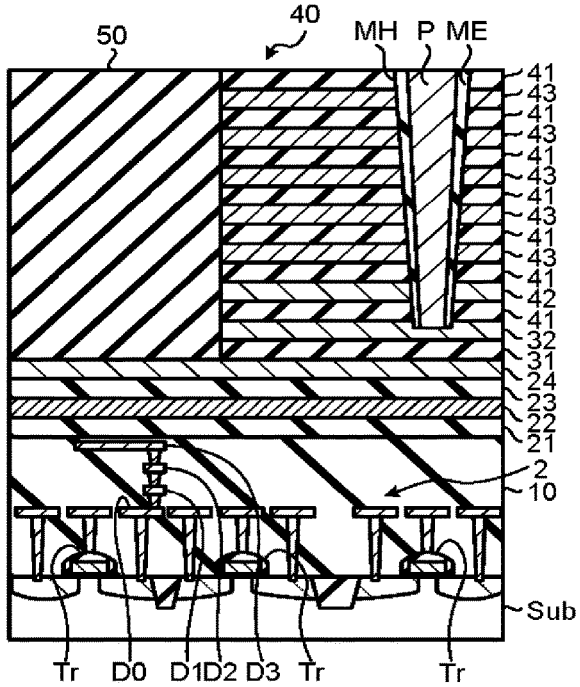

As illustrated in FIG. 3D, clearances formed after removal of the sacrifice layers 44 are filled with a conductive material such as tungsten through the slit, and in this manner, the conductive layers 43 are formed. In this manner, the multilayer structure 40 including the insulating layers 41, the conductive layer 42, and the conductive layers 43 is formed.

Figure 4A:
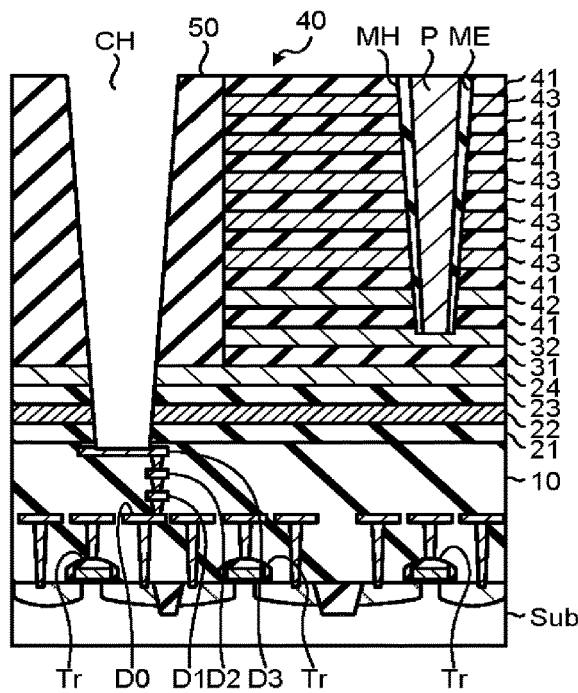
FIGS. 4A to 4C are flow diagrams illustrating one example of the steps of the processing of manufacturing the semiconductor device according to the embodiment.

As illustrated in FIG. 4A, in the peripheral region PER, the contact holes CH penetrating the interlayer insulating layer 50, the etching stopper layer 24, the adhesion layer 23, the etching stopper layer 22, and the adhesion layer 21 and reaching the wiring layer D3 at the bottom portions are formed.

Figure 4B:
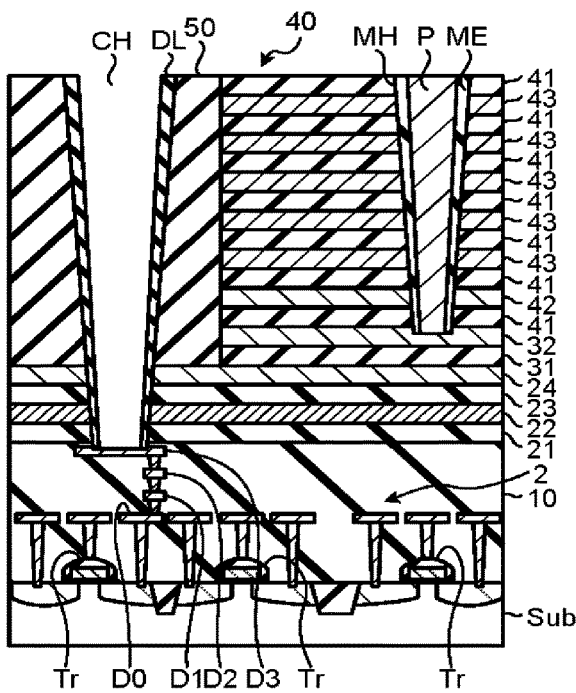

As illustrated in FIG. 4B, the insulating layer DL is formed so as to cover the inner wall of each contact hole CH.

Figure 4C:
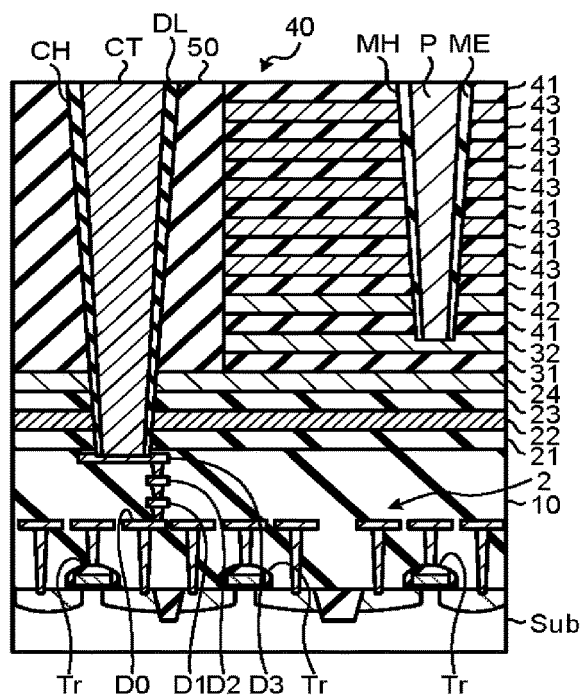

As illustrated in FIG. 4C, the further inside of the insulating layer DL is filled with a conductive material such as tungsten, and in this manner, the contact CT connected to the wiring layer D3 is formed. Thereafter, for example, the upper layer wiring (not illustrated) connecting the control circuit 2 and the memory cells MC through the contact CT is formed.

As described above, the processing of manufacturing the semiconductor device 1 of the embodiment ends.

Comparison Example

In the processing of manufacturing the semiconductor device 1 as described above, a hole pattern is, using, for example, a photoresist, formed in the cell array region ARR to form the memory holes MH. At this point, there is a probability that a defect is caused in photolithography processing and an erroneous formation pattern is formed at an unintended position in the cell array region ARR or the peripheral region PER. The erroneous formation pattern does not always have a hole shape pattern, and might have a groove shape or an irregular shape and have a larger opening than that of a regular hole pattern.

Figure 5A:
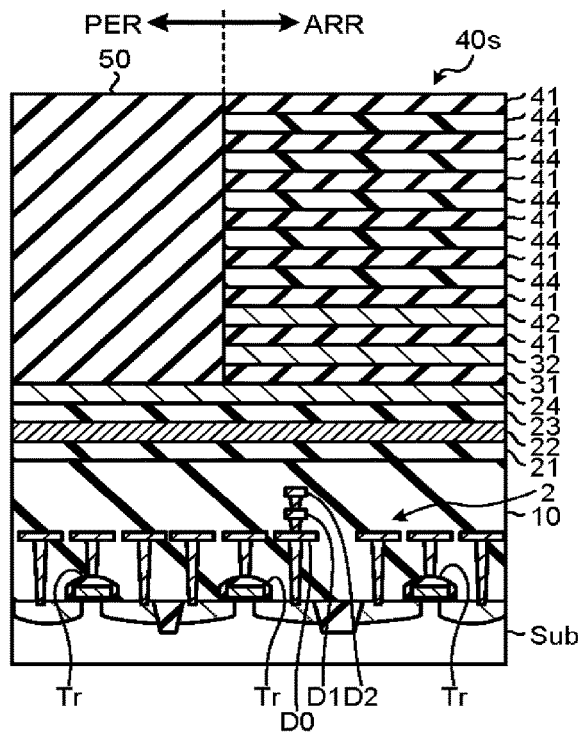
FIGS. 5Aa and 5Ba are flow diagrams illustrating one example of the steps of the processing of manufacturing semiconductor devices according to the embodiment and a comparative example.
Figure 5A:
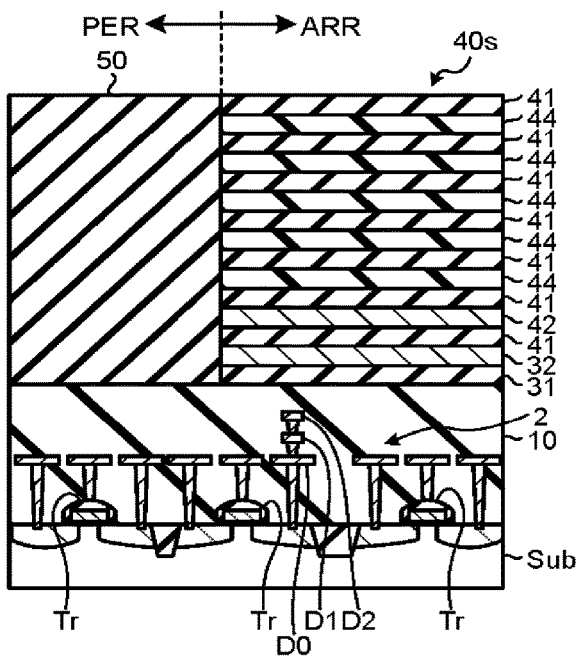
Figure 6A:
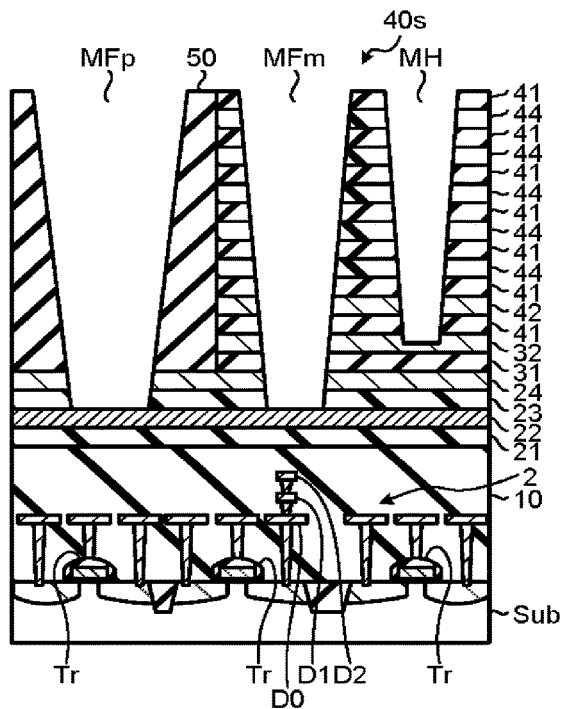
FIGS. 6Aa and 6Ba are flow diagrams illustrating one example of the steps of the processing of manufacturing semiconductor devices according to the embodiment and the comparative example.
Figure 6A:
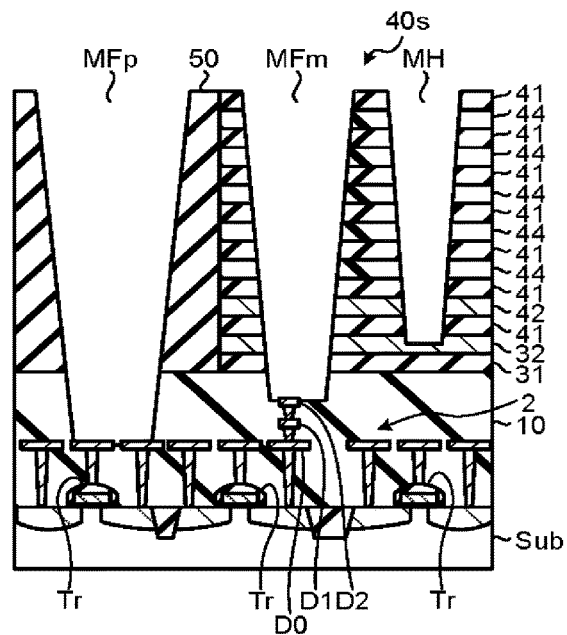

Examples in cases where erroneous formation patterns MFm and MFp are formed in the semiconductor device 1 of the embodiment and a semiconductor device of a comparative example are compared with each other with reference to FIGS. 5Aa to 5Bb and FIGS. 6Aa to 6Bb. FIGS. 5Aa to 5Bb and FIGS. 6Aa to 6Bb are flow diagrams illustrating one example of the steps of the processing of manufacturing the semiconductor devices according to the embodiment and the comparative example. In FIGS. 5Aa to 5Bb and FIGS. 6Aa to 6Bb, left views illustrate the semiconductor device 1 of the embodiment, and right views illustrate the semiconductor device of the comparative example.

First, the semiconductor device of the comparative example will be described.

As illustrated in FIG. 5Ab, a control circuit 2 is formed on a substrate Sub, a multilayer structure 40s is formed in a cell array region ARR, and an interlayer insulating layer 50 is formed in a peripheral region PER. At this point, in the semiconductor device of the comparative example, neither an etching stopper layer 22 nor an etching stopper layer 24 is formed.

Figure 5B:
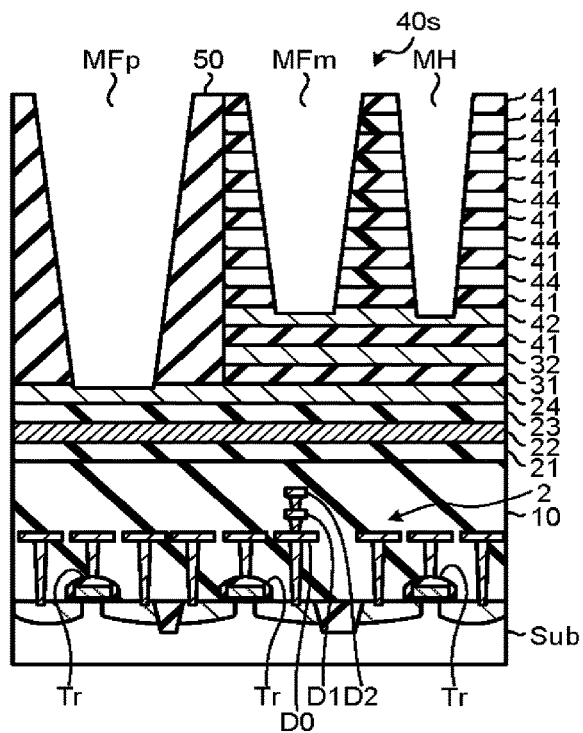
Figure 5B:
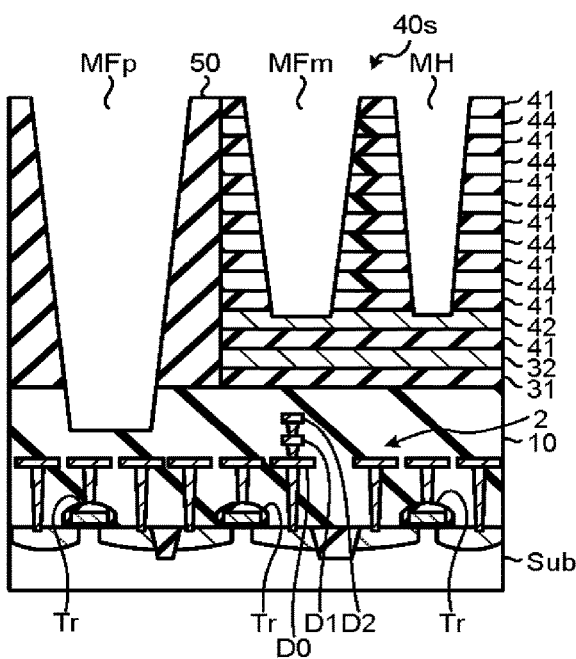

As illustrated in FIG. 5Bb, memory holes MH reaching a conductive layer 42 at bottom portions are formed in the cell array region ARR. At this point, the conductive layer 42 functions as an etching stopper, and therefore, it is assumed that a bottom portion of the erroneous formation pattern MFm formed in the cell array region ARR is on or in the conductive layer 42 without penetrating the conductive layer 42. However, no conductive layer 42 is present in the peripheral region PER, and therefore, it is assumed that a bottom portion of the erroneous formation pattern MFp formed in the peripheral region PER penetrates the interlayer insulating layer 50 and reaches an interlayer insulating layer 10 covering the control circuit 2. It is assumed that depending on the position of the erroneous formation pattern MFp, part of, for example, wiring layers D0 to D3 of the control circuit 2 might be exposed at the bottom portion of the erroneous formation pattern MFp.

As illustrated in FIG. 6Ab, the memory holes MH in the cell array region ARR are further additionally dry-etched, and the bottom portions thereof reach a source wiring layer 32. The erroneous formation pattern MFm formed in the cell array region ARR might have a low aspect ratio to a greater opening than that of the memory hole MH, for example. For this reason, in the erroneous formation pattern MFm, dry etching progresses faster than that in the memory hole MH. Thus, it is assumed that the bottom portion of the erroneous formation pattern MFm penetrates the source wiring layer 32 etc. and reaches the interlayer insulating layer 10. It is assumed that depending on the position of the erroneous formation pattern MFm, part of, for example, the wiring layers D0 to D3 of the control circuit 2 might be exposed at the bottom portion of the erroneous formation pattern MFm. It is assumed that the bottom portion of the erroneous formation pattern MFp formed in the peripheral region PER reaches a much deeper position of the interlayer insulating layer 10. The probability that, for example, the wiring layers D0 to D3 are exposed at the bottom portion is further increased.

Figure 6B:
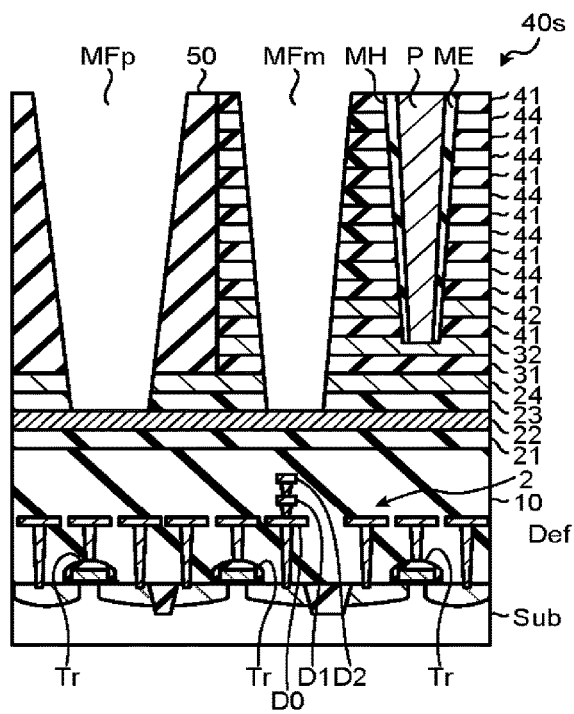
Figure 6B:
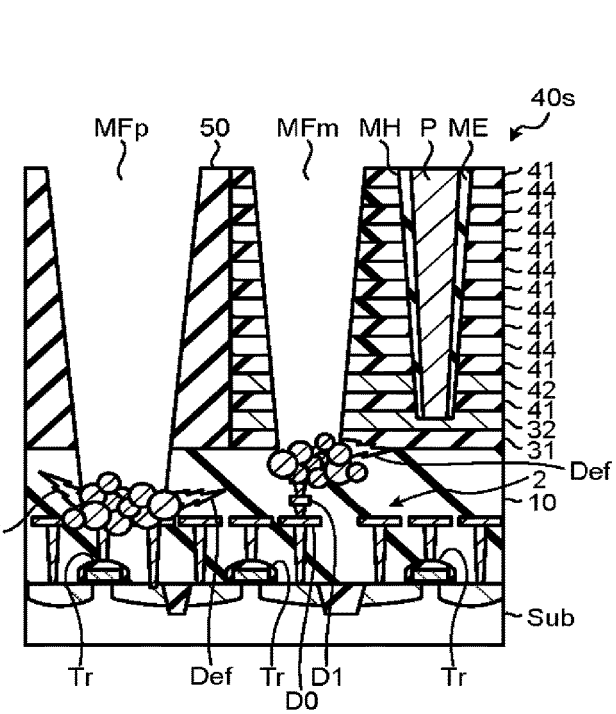

As illustrated in FIG. 6Bb, in a case where, for example, the wiring layers D0 to D3 are exposed at the bottom portions of the erroneous formation patterns MFm and MFp, the exposed wiring layers D0 to D3 are abnormally oxidized by, for example, oxidization processing performed in subsequent memory layer ME formation, and volume expansion occurs. Accordingly, a defect Def such as film separation is caused in, for example, the multilayer structure 40s. When such a defect Def is caused, not only dies with the erroneous formation patterns MFm and MFp but also dies therearound become defective, and a yield ratio is lowered.

Next, the semiconductor device 1 of the embodiment will be described.

As illustrated in FIG. 5Aa, the control circuit 2 is formed on the substrate Sub, the multilayer structure 40s is formed in the cell array region ARR, and the interlayer insulating layer 50 is formed in the peripheral region PER. At this point, in the semiconductor device 1 of the embodiment, the etching stopper layers 22 and 24 are formed in both of the cell array region ARR and the peripheral region PER as described above.

As illustrated in FIG. 5Ba, the memory holes MH reaching the conductive layer 42 at the bottom portions are formed in the cell array region ARR. At this point, the conductive layer 42 is used as the etching stopper as described above.

Thus, the conductive layer 42 functions as the etching stopper, and therefore, the bottom portion of the erroneous formation pattern MFm formed in the cell array region ARR is on or in the conductive layer 42 without penetrating the conductive layer 42.

Moreover, due to the presence of the etching stopper layer 24, the bottom portion of the erroneous formation pattern MFp formed in the peripheral region PER is on or in the etching stopper layer 24 without penetrating the etching stopper layer 24.

As described above, the etching stopper layer 24 has the same main component as that of the conductive layer 42. Thus, the etching stopper layer 24 has etching resistance against etching of the insulating layers 41 and the sacrifice layers 44 in memory hole MH formation as described above. In other words, under these etching conditions, the etching rate of the etching stopper layer 24 is lower than those of the insulating layer 41 and the sacrifice layer 44, and the insulating layer 41 and the sacrifice layer 44 have etching selectivity for the etching stopper layer 24. Thus, the etching stopper layer 24 functions as the etching stopper under memory hole MH formation conditions.

As illustrated in FIG. 6Aa, the memory holes MH in the cell array region ARR are further additionally dry-etched, and the bottom portions thereof reach the source wiring layer 32. At this point, the conditions for actively etching the conductive layer 42 and the insulating layers 41 are used as described above.

The erroneous formation pattern MFm formed in the cell array region ARR might have a low aspect ratio due to a larger opening than that of the memory hole MH, for example. Thus, in the erroneous formation pattern MFm, drying etching progresses faster than that in the memory hole MH. Thus, the bottom portion of the erroneous formation pattern MFm penetrates, for example, the source wiring layer 32 and the etching stopper layer 24. As described above, the source wiring layer 32 and the etching stopper layer 24 made of the same type of material as that of the conductive layer 42 do not fulfill the function of the etching stopper. However, due to the presence of the etching stopper layer 22, the bottom portion of the erroneous formation pattern MFm is on or in the etching stopper layer 22 without penetrating the etching stopper layer 22.

As described above, the etching stopper layer 22 is greatly different from the conductive layer 42 and the source wiring layer 32 in a material. Thus, the etching stopper layer 22 has etching resistance against etching of the conductive layer 42 and the insulating layers 41 in additional processing of the memory holes MH. In other words, under these etching conditions, the etching rate of the etching stopper layer 22 is lower than those of the conductive layer 42 and the insulating layer 41, and the conductive layer 42 and the insulating layer 41 have etching selectivity for the etching stopper layer 22. Thus, the etching stopper layer 22 functions as the etching stopper under the memory hole MH formation conditions.

The bottom portion of the erroneous formation pattern MFp formed in the peripheral region PER penetrates the etching stopper layer 24. As described above, the etching stopper layer 24 having the same main component as those of the conductive layer 42 and the source wiring layer 32 does not fulfill the function of the etching stopper. However, due to the presence of the etching stopper layer 22, the bottom portion of the erroneous formation pattern MFp is on or in the etching stopper layer 22 without penetrating the etching stopper layer 22.

As illustrated in FIG. 6Ba, for example, the wiring layers D0 to D3 are not exposed at the bottom portions of the erroneous formation patterns MFm and MFp. Thus, abnormal oxidization of, for example, the wiring layers D0 to D3 and occurrence of volume expansion due to, for example, subsequent oxidization processing are reduced. Thus, even when dies with the erroneous formation patterns MFm and MFp become defective, a state where dies therearound become defective can be reduced, and the yield ratio can be improved.

The etching stopper layer 22 exposed at the bottom portions of the erroneous formation patterns MFm and MFp is exposed to oxidization processing in memory layer ME formation. However, the etching stopper layer 22 is made of a material having oxidative resistance or a material not causing volume expansion at least due to abnormal oxidization.

In addition, the exposed etching stopper layer 22 might be exposed to, for example, hot phosphoric acid, hydrofluoric acid, a sulfuric acid-hydrogen peroxide mixture, a choline water solution (TMY), and is preferably made of a material resistant to these materials.

In formation of the contact holes CH, the etching stopper layers 22 and 24 need to be etching-removed by, for example, dry etching. The etching stopper layers 22 and 24 are preferably made of an easy-to-process material.

In addition, for avoiding influence on properties of the semiconductor device 1, the etching stopper layers 22 and 24 preferably have excellent adhesion, high insulating properties, and low, permittivity. The etching stopper layers 22 and 24 have low permittivity so that an inter-wiring capacity can be reduced.

The semiconductor device 1 of the embodiment includes the etching stopper layers 22 and 24 below the source wiring layer 32. Thus, even when the erroneous formation pattern is caused, a state in which the bottom portion of the erroneous formation pattern reaches the region of the control circuit 2 and, for example, the wiring layers D0 to D3 are exposed is reduced. Thus, a state in which the defect Def such as film separation is caused due to abnormal oxidization of, for example, the wiring layers D0 to D3 and influences surrounding dies can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a control circuit arranged on a substrate;
   a first conductive layer arranged on the control circuit and containing a first element as a main component;
   a multilayer structure arranged on the first conductive layer and configured such that multiple second conductive layers and multiple insulating layers are alternately stacked on each other;
   a memory layer penetrating the multilayer structure and reaching the first conductive layer at a bottom portion;
   a first layer arranged between the control circuit and the first conductive layer and containing the first element as a main component;
   a second layer arranged between the control circuit and the first layer and containing, as a main component, a second element different from the first element;
   a memory region having the multilayer structure where the memory layer is arranged; and
   a peripheral region arranged at a periphery of the memory region, wherein
   the first layer and the second layer are arranged in the memory region and the peripheral region.

2. The semiconductor device according to claim 1, wherein the first layer contains silicon as the first element.

3. The semiconductor device according to claim 1, wherein
   the first layer includes at least any of a polysilicon layer, an amorphous silicon layer, a silicon carbide layer, and an oxygen-containing silicon carbide layer.

4. The semiconductor device according to claim 1, wherein
   the second layer includes, as the second element, metal oxide containing at least one or more types of elements including Al, Zr, Ti, Hf, and Ta.

5. The semiconductor device according to claim 2, wherein
   the first conductive layer contains silicon as the first element.

6. The semiconductor device according to claim 3, wherein
   the first conductive layer includes a polysilicon layer.

7. The semiconductor device according to claim 1, wherein
   the second layer includes an aluminum oxide layer.

8. The semiconductor device according to claim 1, wherein
   the second layer is an etching stopper layer for etching using the first conductive layer as an etching stopper layer.

9. The semiconductor device according to claim 1, wherein
   the multilayer structure has, at a lower layer, a third conductive layer containing the first element as a main component.

10. The semiconductor device according to claim 9, wherein
    the third conductive layer contains silicon as the first element.

11. The semiconductor device according to claim 9, wherein
    the third conductive layer includes a polysilicon layer.

12. The semiconductor device according to claim 9, wherein
    the second layer is an etching stopper layer for etching using the first conductive layer as an etching stopper layer.

13. The semiconductor device according to claim 12, wherein
    in the etching using the first conductive layer as the etching stopper layer, the third conductive layer is etched.

14. The semiconductor device according to claim 9, wherein
    the first layer is an etching stopper layer for etching using the third conductive layer as an etching stopper layer.

15. The semiconductor device according to claim 14, wherein
    in the etching using the third conductive layer as the etching stopper layer,
    a multilayer structure configured such that multiple layers before replacement with the second conductive layers and the multiple insulating layers are alternately stacked on each other is etched.

16. The semiconductor device according to claim 9, wherein
    the memory layer is formed in a memory hole penetrating the multilayer structure and reaching the first conductive layer at a bottom portion, and
    the memory hole is formed in such a manner that
    a multilayer structure configured such that multiple layers before replacement with the second conductive layers and the multiple insulating layers are alternately stacked on each other is etched using the third conductive layer as an etching stopper layer, and
    the third conductive layer is etched using the first conductive layer as an etching stopper layer.

17. The semiconductor device according to claim 16, wherein
    when the third conductive layer is etched in formation of the memory hole,
    the second layer acts as an etching stopper layer in an erroneous formation pattern formed by photolithography processing for forming the memory hole, and
    the erroneous formation pattern is a pattern formed at an unintended position in the memory region or the peripheral region.

18. The semiconductor device according to claim 16, wherein
    when the multilayer structure is etched in formation of the memory hole,
    the first layer acts as an etching stopper layer in an erroneous formation pattern formed by photolithography processing for forming the memory hole, and
    the erroneous formation pattern is a pattern formed at an unintended position in the memory region or the peripheral region.

19. The semiconductor device according to claim 18, wherein the erroneous formation pattern is formed in the peripheral region.

20. A semiconductor device comprising:
    a control circuit arranged on a substrate;
    a first conductive layer arranged on the control circuit and containing a first element as a main component;
    a multilayer structure arranged on the first conductive layer and configured such that multiple second conductive layers and multiple insulating layers are alternately stacked on each other;
    a memory layer penetrating the multilayer structure and reaching the first conductive layer at a bottom portion;

a first layer arranged between the control circuit and the first conductive layer and containing the first element as a main component; and a second layer arranged between the control circuit and the first layer and containing, as a main component, a second element different from the first element, wherein the second layer includes, as the second element, metal oxide containing at least one or more types of elements including Al, Zr, Ti, Hf, and Ta.

* * * * *